(12) United States Patent
Fang

(10) Patent No.: US 6,175,522 B1
(45) Date of Patent: Jan. 16, 2001

(54) READ OPERATION SCHEME FOR A HIGH-DENSITY, LOW VOLTAGE, AND SUPERIOR RELIABILITY NAND FLASH MEMORY DEVICE

(75) Inventor: Hao Fang, Cupertino, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/408,846

(22) Filed: Sep. 30, 1999

Related U.S. Application Data

(60) Provisional application No. 60/135,093, filed on Sep. 30, 1998.

(51) Int. Cl.[7] .................................................. G11C 16/04
(52) U.S. Cl. .................. 365/185.18; 365/185.17
(58) Field of Search .......................... 365/185.17, 185.21, 365/185.18, 185.24

(56) References Cited

U.S. PATENT DOCUMENTS

| | | | |
|---|---|---|---|
| 5,253,206 | * 10/1993 | Tanaka et al. | 365/189.09 |
| 5,734,609 | * 3/1998 | Choi et al. | 365/185.17 |
| 5,808,935 | * 9/1998 | Kwon et al. | 365/185.17 |
| 5,991,202 | * 11/1999 | Derhacobian et al. | 365/185.19 |
| 6,011,287 | * 1/2000 | Itoh et al. | 365/185.17 |
| 6,028,788 | * 2/2000 | Choi et al. | 365/185.11 |

\* cited by examiner

*Primary Examiner*—Son Mai

(57) ABSTRACT

The source end of a NAND string in a scalable, lower voltage flash memory device is biased during a memory read operation to prevent problems associated with punch-through. Due to the biasing, the channel length of the floating gate transistors in the flash memory device can be shortened, and the pass voltage employed during the memory read operation can be lowered.

17 Claims, 2 Drawing Sheets

READ OPERATION SCHEME FOR A HIGH-DENSITY, LOW VOLTAGE, AND SUPERIOR RELIABILITY NAND FLASH MEMORY DEVICE

RELATED APPLICATIONS

This application claims the benefit of U.S. Provisional Patent Application Serial No. 60/135,093 filed on Sep. 30, 1998 the contents of which are hereby incorporated by reference in their entirety.

FIELD OF THE INVENTION

The present invention relates to non-volatile semiconductor flash memory devices and, more particularly, to a scalable, lower voltage NAND flash memory device.

BACKGROUND OF THE INVENTION

Conventional flash memory devices, otherwise known as flash electrically erasable programmable read only memories (FLASH EEPROMs), typically include a two-dimensional array of floating gate memory transistors, or "cells," formed on a semiconductor substrate. These cells are arranged into strings, known as NAND strings, to form bit lines, wherein each cell is coupled to the next cell in the string by coupling the source of one transistor to the drain of another transistor. Word lines, disposed perpendicularly to the bit lines, connect to the control gate of one transistor in each NAND string.

A portion of a flash memory circuit, including three bit lines 302, 304, and 306 and four of sixteen word lines, is depicted in FIG. 3. Each bit line, e.g. bit line 304, comprises a NAND string of floating gate transistors coupled in series source to drain, for example, transistors 310, 312, and 314 for bit line 304. FIG. 4 shows a cross-section of floating gate transistors 310, 312, and 314 on bit line 304. Floating gate transistor 312 is formed on a substrate 400, having a source region 402 (which is a drain region for neighboring transistor 314), a drain region 404 (which is a source region for neighboring transistor 310), and a doped channel region 406. A gate oxide 408 is formed on the channel region 406 to insulate the floating gate 410 from the channel region 406. An insulating layer 412 physically and electrically separates the floating gate 410 from a control gate 414, which is coupled to an appropriate word line, e.g., word line 2 for floating gate transistor 312.

Initially, the cells in a flash memory are erased so that the floating gate memory transistors are at a certain threshold voltage, such as about −2V. Selected cells are programmed by applying a high voltage, such as about 18V–23V, to the word lines of the selected cells. For example, selected cell 312 is programmed by applying a high voltage to word line 2. Applying the programming voltage causes electrons tunneling from the silicon substrate to the floating gate 410 of a selected flash memory transistor 312, thereby increasing the threshold voltage of the selected flash memory transistor 312 to a positive voltage, such as about +1V. By adjusting the threshold voltage of selected floating gate memory transistors, flash memory cells are programmed to store data.

A conventional approach for reading data from a selected memory cell involves selecting a bit line by applying a 1V bias to the drain end of a selected bit line and grounding the drain ends of unselected bit lines and the source ends of both selected and unselected bit lines. A memory cell on a particular word line is selected by applying a gate voltage ($V_{GATE}$) of about 0V to the word line and by applying a pass voltage ($V_{PASS}$) of about 4.5V to the other word lines. The pass voltage is sufficient to cause unselected cells on the selected bit line to turn on. Referring to FIG. 3, if the floating gate transistor 312 of a selected cell has been programmed to a 1V threshold voltage, then the gate voltage $V_{GATE}=0$ is insufficient to turn the floating transistor 312 on and very little drive current is produced from the selected transistor for the selected bit line indicating that the selected cell is programmed. On the other hand, if the floating gate transistor 312 of the selected cell is still at the erased threshold voltage (e.g. at −2V), then the floating gate transistor 312 is on, since the gate voltage $V_{GATE}=0$ is greater than the threshold voltage (−2V). Accordingly, a drive current is produced for the selected bit line indicating that the selected cell is erased.

Escalating demands for high density and performance associated with flash memory devices challenge the limitations of conventional flash memory technology. For example, it is desirable to reduce the channel length of the floating gate transistor to pack the transistors more densely. However, merely shortening the channel length from a conventional 0.25 μm to produce smaller transistors creates a "punchthrough" condition. Referring again to FIG. 4, punchthrough is a malfunction which occurs when the depletion region 420 caused by a source-drain bias extends through the entirety of the channel region 406 and short-circuits the transistor. Consequently, the transistor is always turned on and thus appears to be always erased even though it is programmed.

Furthermore, the conventional flash memory device depicted in FIG. 3 requires a 4.5V pass voltage. As lower power supply voltages, e.g. 3.3V, become more popular, however, it is desirable to use a lower pass voltage, commensurate with the power voltage, and to reduce the silicon substrate doping concentration for improved tunnel oxide integrity and product reliability. However, merely reducing the doping level of the channel region to reduce the threshold voltage for the lower pass voltage exacerbates the punchthrough problem. Consequently, conventional flash memory devices employ additional voltage boosting circuitry, such as a charge pump, to provide a 4.5V pass voltage from a 3.3V power supply. This additional circuitry increases the die size and hinders scalability.

When the pass voltage on the unselected cell in the selected bit line is increased, however, the electric field across the tunnel oxide is also increased. This electric field encourages electrons to leak into the floating gate from the silicon substrate through trap assisted tunneling processes. Since the rate of charge leakage is exponentially proportional to the electric field, a high pass voltage results in a greater occurrence of a charge gain error and impairs device reliability. Therefore, it is also desirable to lower the pass voltage to reduce the occurrence of "read disturb," an error condition in which a cell is accidentally programmed during a read operation.

SUMMARY OF THE INVENTION

There exists a need for scalable flash memory device in which the channel length of the floating gate transistors can be smaller than 0.25 μm, especially without the problems of punchthrough associated with conventional devices. There is also a need for a flash memory that can use a lower power supply voltage, eg. 3.3V, without requiring additional voltage boosting circuitry or encountering the problems associated with punchthrough and read disturb.

This and other needs are addressed by the present invention in which the source end of the NAND string is biased with a voltage of at least about 0.5V, preferably from about 0.1V to about 1.5V. Biasing the source end of a floating transistor in accordance with the present invention raises the potential batter at the source side and reduces the extent of the depletion region and, hence, the occurrence of punch-through. Consequently, the channel length can be decreased to improve scalability and the doping level of the channel region can be reduced to enable the use of lower pass voltages commensurate with smaller power supply voltages. As a result, the charge retention and reliability of a memory cell be significantly improved.

Accordingly, one aspect of the invention relates to a method of reading a selected memory cell in a bit line including a string of memory transistors coupled drain to source in series. Each of the memory transistors has a gate coupled to a respective word line. The method includes applying a source end potential about 0.5V to a source end of the string of memory transistors and reading the selected memory cell while the source end is biased to about 0.5V. Preferably, the source end potential is in the range from about 0.1V to about 1.5V, the potential at the drain end of the selected string is at least about 1.0V higher than the source end potential, and a pass voltage is about 3.0V to about 3.3V.

Another aspect of the invention involves a nonvolatile memory device comprising strings of memory transistors coupled drain to source in series to form respective bit lines, word lines coupled across the bit lines to a gate of one of the memory transistors in each of the bit lines; and a source end bias circuit for applying a source end potential to a source end of a selected bit line to about 0.5V during a memory read operation. Preferably, the source end potential is in the range from about 0.1V to about 1.5V, the potential at the drain end of the selected string is at least about 1.0V higher than the source end potential, a pass voltage is about 3.0V to about 3.3V, and the channel length of the memory transistors is about 0.22 μm or shorter.

In one embodiment, the device can be favorably doped such that the threshold voltage of the memory cell at the ultraviolet (UV) state (after UV erase with zero programmed charge in the floating gate) is less than or equal to 0.8V. Therefore, a minimum $V_{DS}$ if about 1.0V between the source and the drain of a selected cell can be maintained after pass unselected cells in the strings with a minimum voltage of 1.5V at the drain end of the string. Moreover, lowering the doping, for example to a concentration from about $1 \times 10^{12}$ doping atoms/cm$^3$ to about $2 \times 10^{12}$ doping atoms/cm$^3$ makes the programmed threshold voltage as close to the UV threshold voltage as possible. At the UV state, the intrinsic electric field across the tunnel oxide is at or very close to zero due to a neutralized floating gate and hence improves data retention.

Additional advantages and novel features of the present invention will be set forth in part in the description that follows, and in part, will become apparent upon examination or may be learned by practice of the invention. The advantages of the invention may be realized and obtained by means of the instrumentalities and combinations particularly pointed out in the appended claims.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

A circuit and method for biasing the source end of a NAND string while reading a selected flash memory cell are described. In the following description, for purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The present invention stems from the realization that biasing the source end of a NAND string increases the so-called "body effect." The body effect occurs when the source-body bias of a MOSFET transistor causes an inversion in the channel region reducing the extent of the depletion region that causes punchthrough to occur. By biasing the source end of the NAND string in a flash memory system, the constraints on the minimum channel length and the doping level can be relaxed. For example, if the source end bias ($V_{SS}$) is about 1V, then the channel length of the transistor can be reduced from about 0.25 μm to about 0.22 μm and below. Furthermore, the doping level can be reduced to enable lower pass voltages, e.g. at a lower power supply level, thereby reducing read disturb and improving tunnel oxide integrity. Since biasing the source end will tend to reduce the saturate drain current ($I_{DSAT}$) of a selected transistor, the drain end is preferably biased to a potential ($V_{DD}$) of about 1.0V greater than the source end bias to maintain the drive current. Alternatively, the drive current can also be enhanced by reducing the channel length.

Figure 1:
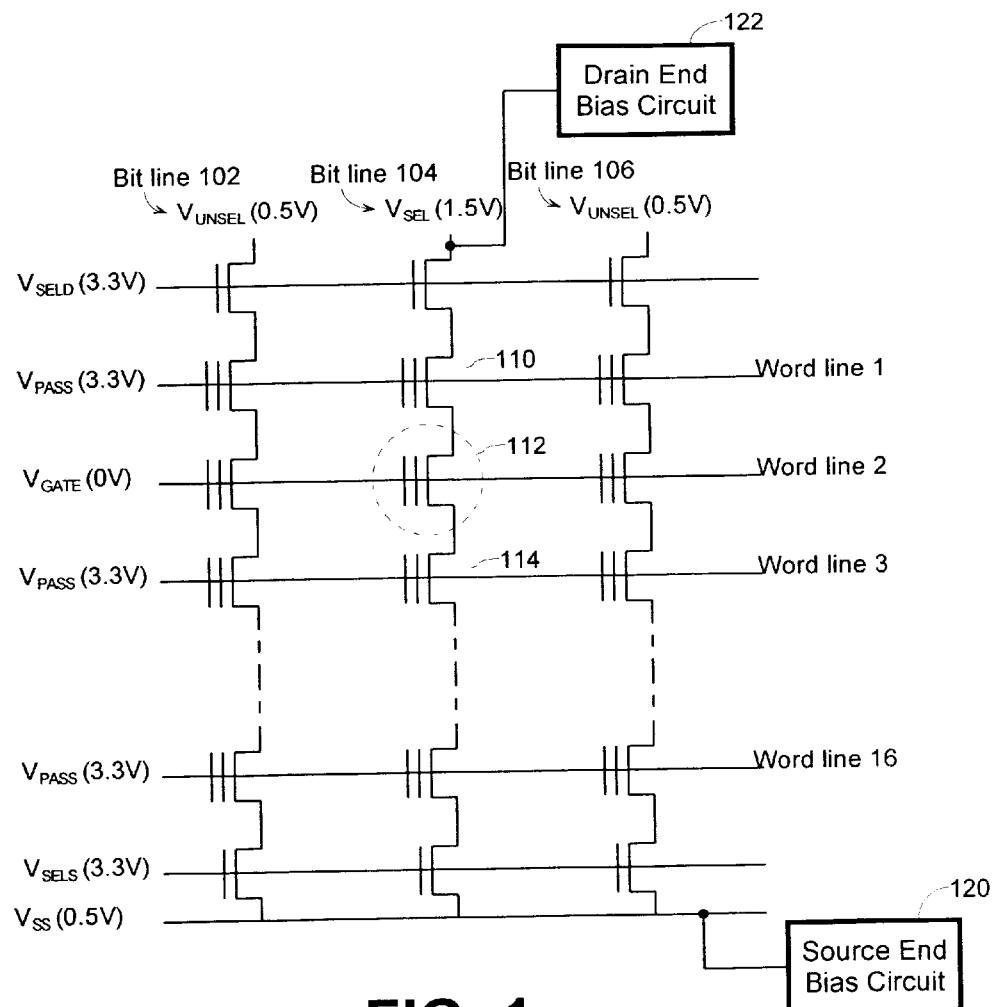
FIG. 1 is a schematic diagram of a flash memory system according to an embodiment of the present invention.

According to certain embodiments of the invention, the source end of a NAND string of a selected bit line is biased by applying a potential of about 0.5V. In this embodiment, the flash memory device can be operated at a lower power supply voltage $V_{CC}$ of about 3.3V, which according to industry standards may range from about 3.0V to about 3.6V. Since it is desirable for the drain end potential of a selected bit line $V_{SEL}$ to be about 1.0V greater than the source end potential $V_{SS}$ for improved drive current but less than the power supply voltage $V_{CC}$, the source end bias $V_{SS}$ is preferably in the range from about 0.1V to about 1.5V. A portion of a flash memory circuit including three bit lines 102, 104, and 106 and four of sixteen word lines is depicted in FIG. 1 in which the source end potential $V_{SS}$ of a selected bit line 104 is biased to about 1.0V and the drain end potential of the selected bit line $V_{SEL}$ is biased to about 2.0. In addition, the pass voltage $V_{PASS}$ is reduced to a lower power supply voltage $V_{CC}$, which is in the range from about 3.0V to about 3.6V but preferably about 3.3V. The source end bias circuit 120 for applying the source end bias $V_{SS}$ and the drain end bias circuit 122 can be implemented with simple voltage regulation circuitry, e.g. using one or more transistors, that does not necessarily require a charge pump especially in the embodiment wherein the drain end bias for a selected bit line $V_{SEL}$ is set to be less than the power supply voltage $V_{CC}$. For example, a transistor with a threshold voltage $V_T$ of about 0.5V can provide a source end bias of about 0.5V.

Figure 2:
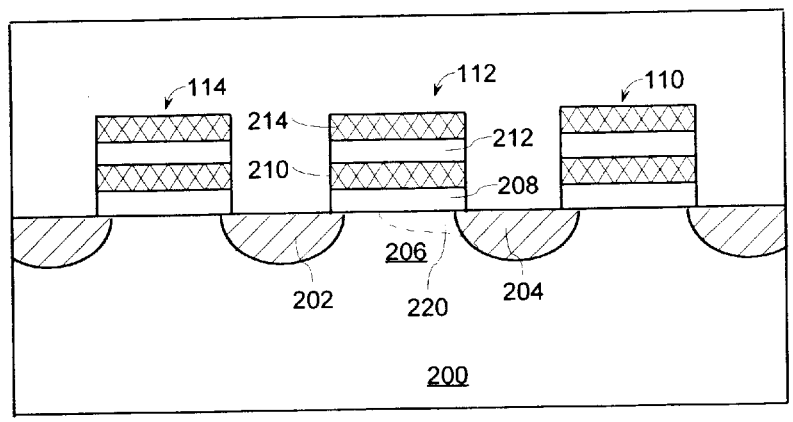
FIG. 2 is a cross-section view of a bit line in a flash memory system according to an embodiment of the present invention.
Figure 3:
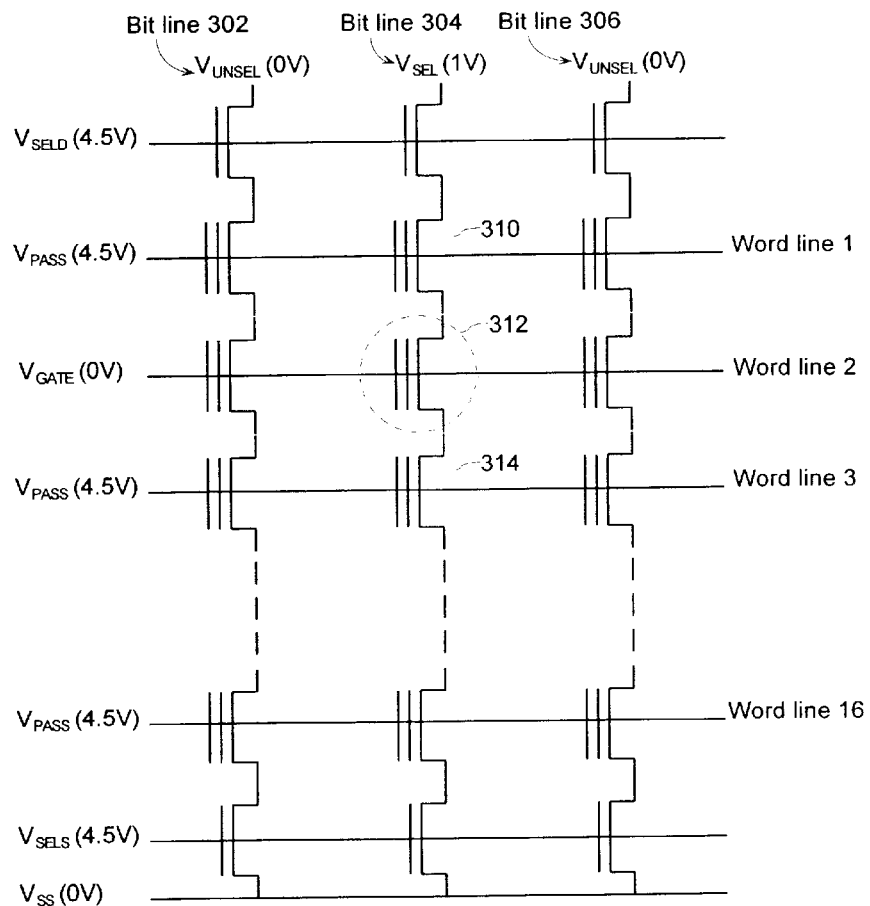
FIG. 3 is schematic diagram of a conventional flash memory system.
Figure 4:
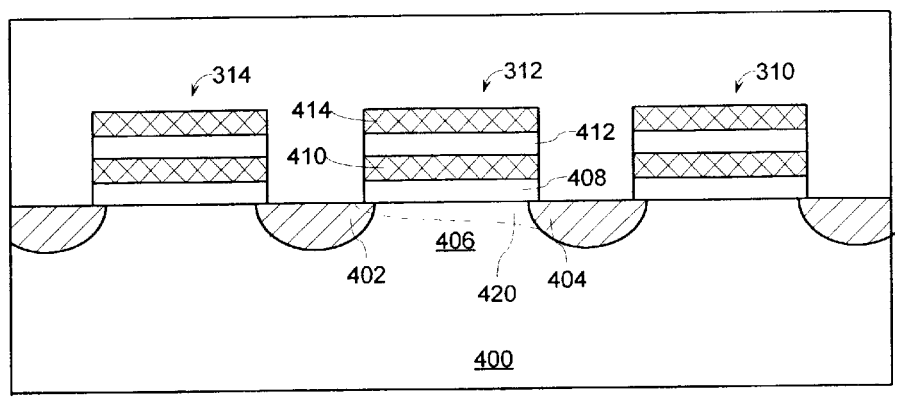
FIG. 4 is a cross-section view of a bit line in a conventional flash memory system.

Each bit line, e.g. bit line 104, comprises a NAND string of floating gate transistors coupled in series source to drain, for example, transistors 110, 112, and 114. FIG. 2 shows a cross-section of floating gate transistors 110, 112, and 114 on bit line 104. Floating gate transistor 112 is formed on a substrate 200, having a source region 202 (which is a drain region for neighboring transistor 114), a drain region 204 (which is a source region for neighboring transistor 110), and a doped channel region 206. A gate oxide 208 is formed on the channel region 206 to insulate the floating gate 210 from the channel region 206. An insulating layer 212 physically and electrically separates the floating gate 210 from a control gate 214, which is coupled to an appropriate word line, e.g., word line 2 for floating gate transistor 112. Even though the length of channel 206, e.g. about 0.20 μm, is smaller than the corresponding conventional channel length, e.g. about 0.25 μm, the length of the depletion region 220 is much smaller due to the source end bias $V_{SS}$ being greater than ground (0V). Accordingly, the depletion region 220 does not extend through the entire channel region 206, thereby avoiding punchthrough.

Reading data from a selected memory cell in accordance with embodiments of the invention therefore involves selecting a bit line by applying an increased bias $V_{SEL}$, e.g. about 1.5V–3.3V, to the drain end of a selected bit line and applying the source end bias $V_{SS}$, e.g. about 0.5V, to the source ends of both selected and unselected bit lines. The bias $V_{UNSEL}$ applied the drain ends of unselected bit lines is equal to the source end bias $V_{SS}$ (e.g. about 0.5V). A memory cell on a particular word line is selected by applying a gate voltage ($V_{GATE}$) of about 0V to the particular word line and by applying a pass voltage ($V_{PASS}$) of about 3.3V to the other word lines. The pass voltage $V_{PASS}$ is sufficient to cause unselected cells on the selected bit line to turn off.

Referring to FIG. 1, if the floating gate transistor 1 12 of a selected cell has been programmed to a 0.8V threshold voltage, then the gate voltage $V_{GATE}=0V$ is insufficient to turn the floating transistor 112 on and very little drive current is produced from the selected transistor for the selected bit line. This little amount of drive current indicates that the selected cell is programmed. On the other hand, if the floating gate transistor 112 of the selected cell is still at the erased threshold voltage (−2V), then the floating gate transistor 112 is on, since the gate voltage $V_{GATE}$ is greater than the threshold voltage. Accordingly, a drive current is produced for the selected bit line indicating that the selected cell is erased.

By biasing the source end of a NAND string during a read operation, problems associated with punchthrough are reduced. Consequently, floating transistors with smaller channel lengths, e.g. about 0.22 μm or below, can be employed, thereby improving scalability and leading to smaller die sizes. Furthermore, the channel region doping can be reduced, thereby enabling a lower pass voltages $V_{PASS}$ e.g. about 3.3V, to be employed during a memory read operation. A lower pass voltage $V_{PASS}$ allows the flash memory device to be used a 3.3V power supply $V_{CC}$ and reduces read disturb. Furthermore, reducing substrate doping from a typical concentration of about $1 \times 10^{12}$ doping atoms/cm$^3$ to a doping concentration from about $1 \times 10^{12}$ doping atoms (e.g. Boron atoms)/cm$^3$ to about $2 \times 10^{12}$ doping atoms/cm$^3$ improves the tunnel oxide integrity and makes possible the programmed voltage threshold equal to about the ultraviolet threshold voltage, which can significantly improve memory cell reliability.

While this invention has been described in connection with what is presently considered to be the most practical and preferred embodiment, it is to be understood that the invention is not limited to the disclosed embodiment, but on the contrary, is intended to cover various modifications and equivalent arrangements included within the spirit and scope of the appended claims.

What is claimed is:

1. A method of reading a selected memory cell in a bit line including a string of memory transistors coupled drain to source in series, each of the memory transistors having a gate coupled to a respective word line, the method comprising:

applying a source end potential of at least about 0.1V to a source end of the string of memory transistors, said memory transistors being disposed on a substrate having a doping concentration such that a programmed voltage threshold value is equal to about the ultraviolet threshold voltage; and reading the selected memory cell while the source end is biased to at least 0.1V.

2. The method of claim 1, wherein the source end potential is from about 0.1V to about 1.5V.

3. The method of claim 1, wherein the source end potential is about 1.0V.

4. The method of claim 1, further comprising applying a drain end potential that is about 1 V higher than the source end potential to a drain end of the string of memory transistors.

5. The method of claim 4, further comprising:

applying a gate voltage of about 0V to the gate of the selected memory cell; and applying a pass voltage of less than about 3.7V to memory cells in the bit line other than the selected memory cell.

6. The method of claim 5, wherein the pass voltage is about 3.0V to about 3.7V.

7. The method of claim 6, wherein the pass voltage is about 3.3V.

8. The method of claim 7, wherein applying a pass voltage includes applying a power supply voltage as the pass voltage.

9. A nonvolatile memory device, comprising:

a plurality of strings of memory transistors coupled drain to source in series to form respective bit lines, each bit line having a drain end and a source end, said memory transistors being disposed on a substrate having a doping concentration such that a programmed voltage threshold value is equal to about the ultraviolet threshold voltage;

a plurality of word lines, each word line coupled across the bit lines to a gate of one of the memory transistors in each of the bit lines; and a source end bias circuit for applying a source end potential to the source end of a selected bit line to at least 0.5V during a memory read operation.

10. The nonvolatile memory device of claim 9, wherein the source end potential is between about 0.5V and about 2.0V.

11. The nonvolatile memory device of claim 9, wherein the source end potential is about 1.0V.

12. The nonvolatile memory device of claim 9, further comprising a drain end bias circuit for applying a drain end potential that is about 1V higher than the source end potential to the drain end of the selected bit line during the memory read operation.

13. The nonvolatile memory device of claim 12, further comprising a circuit for applying a gate voltage of about 0V to a selected word line of for selected memory cell and for applying a pass voltage of less than about 3.7V to word lines other than the selected memory cell.

14. The nonvolatile memory device of claim 13, wherein the pass voltage is about 3.0V to about 3.7V.

15. The nonvolatile memory device of claim 14, wherein the pass voltage is about 3.3V.

16. The nonvolatile memory device of claim 9, wherein a length of a channel of each memory transistor is about 0.2 μm.

17. The nonvolatile memory device of claim 9, wherein said memory transistors are disposed on a substrate having a doping concentration from about $1 \times 10^{12}$ doping atoms/$cm^3$ to about $2 \times 10^{12}$ doping atoms/$cm^3$.

* * * * *